United States Patent
Mongia et al.

(10) Patent No.: US 7,203,064 B2
(45) Date of Patent: Apr. 10, 2007

(54) HEAT EXCHANGER WITH COOLING CHANNELS HAVING VARYING GEOMETRY

(75) Inventors: Rajiv K. Mongia, Portland, OR (US); Himanshu Pokharna, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 189 days.

(21) Appl. No.: 10/735,121

(22) Filed: Dec. 12, 2003

(65) Prior Publication Data

US 2005/0128702 A1    Jun. 16, 2005

(51) Int. Cl.
    *H05K 7/20* (2006.01)
(52) U.S. Cl. ............... 361/701; 361/699; 165/80.4; 165/104.33; 165/185; 257/714
(58) Field of Classification Search ............. 361/687, 361/690–691, 697, 699–703; 165/146, 185, 165/80.3, 80.4–80.5, 104.33; 257/722, 714, 257/713, 715; 174/16.3
See application file for complete search history.

(56) References Cited

U.S. PATENT DOCUMENTS

| | | | | |
|---|---|---|---|---|
| 3,658,584 A | * | 4/1972 | Schmidt | 438/562 |
| 4,381,818 A | * | 5/1983 | Sachar et al. | 165/133 |
| 4,450,472 A | * | 5/1984 | Tuckerman et al. | 257/713 |
| 4,516,632 A | * | 5/1985 | Swift et al. | 165/167 |
| 4,758,926 A | * | 7/1988 | Herrell et al. | 361/699 |
| 4,765,397 A | * | 8/1988 | Chrysler et al. | 165/104.33 |
| 4,944,344 A | * | 7/1990 | Crowe | 165/104.33 |
| 4,953,634 A | * | 9/1990 | Nelson et al. | 165/147 |
| 5,005,640 A | * | 4/1991 | Lapinski et al. | 165/170 |
| 5,304,846 A | * | 4/1994 | Azar et al. | 257/722 |
| 5,437,328 A | * | 8/1995 | Simons | 165/146 |
| 6,118,656 A | * | 9/2000 | Wang | 361/687 |
| 6,223,815 B1 | * | 5/2001 | Shibasaki | 165/185 |
| 6,234,239 B1 | * | 5/2001 | Azar | 165/80.3 |
| 6,263,955 B1 | * | 7/2001 | Azar | 165/80.3 |
| 6,273,186 B1 | * | 8/2001 | Ognibene et al. | 165/185 |
| 6,422,307 B1 | * | 7/2002 | Bhatti et al. | 165/185 |
| 6,466,441 B1 | * | 10/2002 | Suzuki | 361/695 |
| 6,476,484 B1 | * | 11/2002 | Liang | 257/718 |
| 6,903,929 B2 | * | 6/2005 | Prasher et al. | 361/699 |
| 6,942,018 B2 | * | 9/2005 | Goodson et al. | 165/80.4 |
| 7,139,172 B2 | * | 11/2006 | Bezama et al. | 361/699 |
| 2006/0226539 A1 | * | 10/2006 | Chang et al. | 257/712 |

* cited by examiner

*Primary Examiner*—Michael Datskovsky
*Assistant Examiner*—Robert J. Hoffberg
(74) *Attorney, Agent, or Firm*—Alan Pedersen-Giles

(57) ABSTRACT

A device may include an integrated circuit chip and channels to carry a coolant. The channels may be proximate to an upper surface of the integrated circuit chip, and the channels may extend along a length of the integrated circuit chip. A density of the channels may change across the length of the integrated circuit chip.

24 Claims, 5 Drawing Sheets

United States Patent
US 7,203,064 B2

HEAT EXCHANGER WITH COOLING CHANNELS HAVING VARYING GEOMETRY

BACKGROUND

The claimed invention relates to heat exchangers and, more particularly, to heat exchangers for dissipating heat generated by integrated circuits.

Various heat exchangers have been used to dissipate heat generated by integrated circuits, for example within personal computers or similar electrical devices. As power densities have increased in integrated circuits, liquid cooling loops have been proposed to dissipate greater quantities of heat than passive or radiative cooling schemes. In such liquid cooling schemes, a coolant typically may be circulated through cooling channels located in the vicinity of the integrated circuit to be cooled.

Heat may be transferred from the integrated circuit to the coolant in the cooling channels for dissipation in a different portion of the cooling loop. Proposed cooling channel designs typically have assumed a uniformly heated integrated circuit. Certain types of integrated circuits, however, may have a non-uniform power density across their surfaces.

BRIEF DESCRIPTION OF THE DRAWINGS

The accompanying drawings, which are incorporated in and constitute a part of this specification, illustrate one or more implementations consistent with the principles of the invention and, together with the description, explain such implementations. In the drawings.

DETAILED DESCRIPTION

The following detailed description refers to the accompanying drawings. The same reference numbers may be used in different drawings to identify the same or similar elements. Also, the following detailed description illustrates certain implementations and principles, but the scope of the claimed invention is defined by the appended claims and equivalents.

Figure 1A:
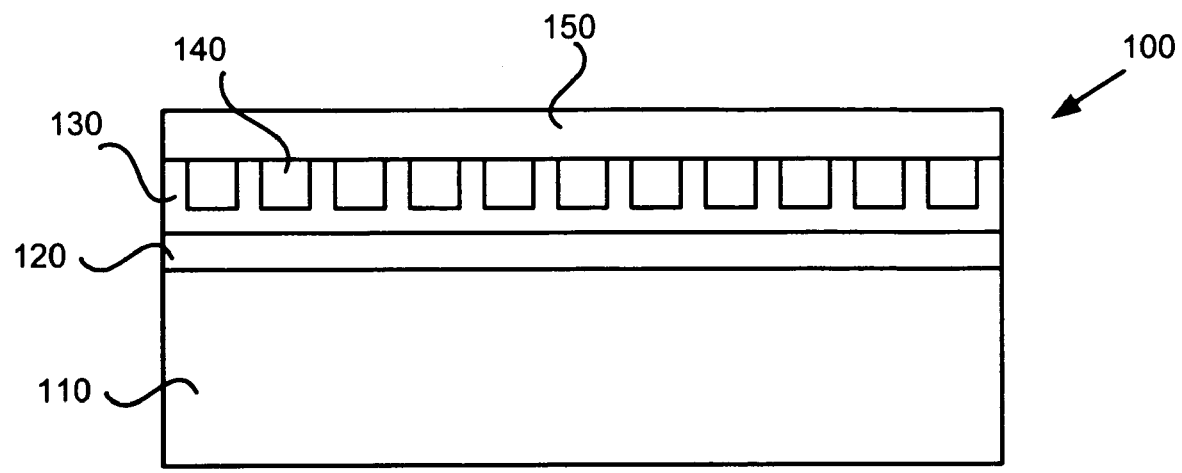
FIGS. 1A and 1B are side views of example implementations of a device consistent with the principles of the invention.

FIG. 1A is a side view of a device 100 consistent with the principles of the invention. Device 100 may include an integrated circuit chip 110, a thermal interface layer 120, a heat exchange layer 130 including channels 140, and a cap 150. It should be noted that only a portion of device 100 is shown in FIG. 1A and that for explanatory purposes certain features, such as channels 140, may not be shown to scale relative to the remainder of device 100.

Integrated circuit chip 110 may include circuitry, such as transistors, that produces heat to be removed from device 100. The top portion of integrated circuit chip 110 illustrated in FIG. 1 may include silicon (Si), germanium (Ge), or another structural or packaging material typically used in integrated circuits. In some implementations consistent with the principles of the invention, integrated circuit chip 110 may include a microprocessor, digital signal processor, graphics processor, or the like that consumes a significant amount of power (e.g., tens to hundreds of watts) and generates a corresponding amount of heat.

Thermal interface layer 120 may include interface material that conducts heat from integrated circuit chip 110 to heat exchange layer 130. Examples of the interface material may include grease, gels, phase change metallic alloys, solders, or epoxies, which may be deposited on or otherwise affixed to integrated circuit chip 110. In some implementations, thermal interface layer 120 may be needed because of difficulties in attaching the material of heat exchange layer 130 to the material of integrated circuit chip 110. In other implementations, thermal interface layer 120 may not be present, and heat exchange layer 130 may be affixed directly to the integrated circuit chip 110 or be part of the integrated circuit chip 110.

Heat exchange layer 130 may be formed over thermal interface layer 120 to remove heat from integrated circuit chip 110. Heat exchange layer 130 may include copper (Cu), aluminum (Al), silicon (Si) or another thermally conductive material. Channels 140 may be etched, machined, or otherwise formed in heat exchange layer 130 to provide conduits for liquid coolant. For explanatory purposes, in FIG. 1A the coolant would flow into or out of the page through channels 140. Although channels 140 are shown as having a rectangular cross-section, other geometries may be used, such as triangular or circular channels 140.

Channels 140 may range in width from about 50 micrometers ($\mu$m) to about 2 millimeters (mm) and may be spaced apart by about walls having a thickness ranging from about 25 $\mu$m to about 1 mm. A higher channel density (e.g., number of channels per unit width of integrated circuit chip 110) of channels 140 may produce greater heat transfer, but may also cause a greater pressure drop of the coolant in the channels 140. A greater pressure drop may motivate a larger coolant pump (not shown) to maintain a given coolant flow rate. Similarly, a proportionally lower channel density may produce somewhat lower heat transfer, but may cause a lower pressure drop of the coolant in the channels 140.

Cap 150 may provide an upper surface to close channels 140. Cap 150 may be attached to heat exchange layer 130 by brazing, a press-fit, or another suitable scheme. Preferably, cap 150 and heat exchange layer 130 may create a liquid-tight fit so that the liquid coolant does not escape from channels 140.

Figure 1B:
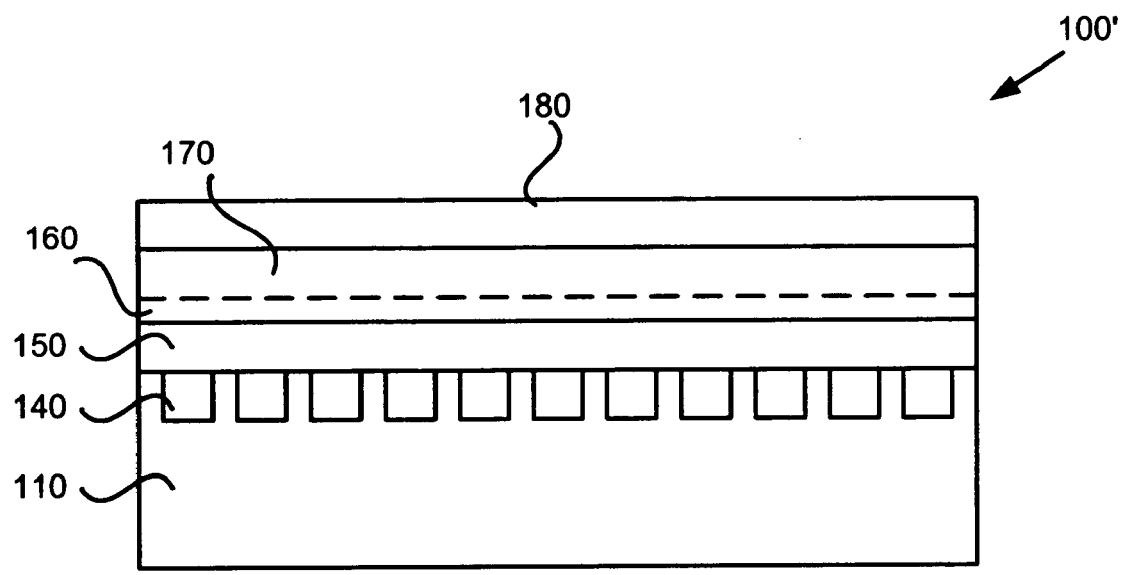

FIG. 1B is a side view of another device 100' consistent with the principles of the invention. Device 100' may include integrated circuit chip 110 and channels 140, and cap 150. Device 100' optionally may also include an upper heat exchanger 160 including upper channels 170, and an upper cap 180.

Integrated circuit chip 110, channels 140, and cap 150 may be as described with respect to FIG. 1A, except that channels 140 may be formed in the material of integrated circuit chip 110. Coolant in channels 140 may directly conduct heat away from integrated circuit chip 110. In such an implementation, cap 150 may be affixed to integrated circuit chip 110 to close channels 140.

In some implementations, device 100' may also include upper heat exchanger 160, which may be similar in structure and function to the previously-described heat exchange layer 130. In some implementations, upper heat exchanger 160 may affixed directly to integrated circuit chip 110, avoiding the use of cap 150. Upper heat exchanger 160 may include a second set of upper channels 170, which may be similar in structure and function to the previously-described channels 140.

As illustrated in FIG. 1B, in some implementations upper channels 170 (illustrated by a dotted line) may run in an orthogonal direction to channels 140 in integrated circuit chip 110. In other implementations, however, upper channels 170 may run in the same direction as channels 140. Upper cap 180 may be similar in structure and function to the previously-described cap 150. Although illustrated in FIG. 1B, it should be noted that optional upper heat exchanger 160, upper channels 170, and upper cap 180 may also be used with device 100 of FIG. 1A if desired.

Figure 2:
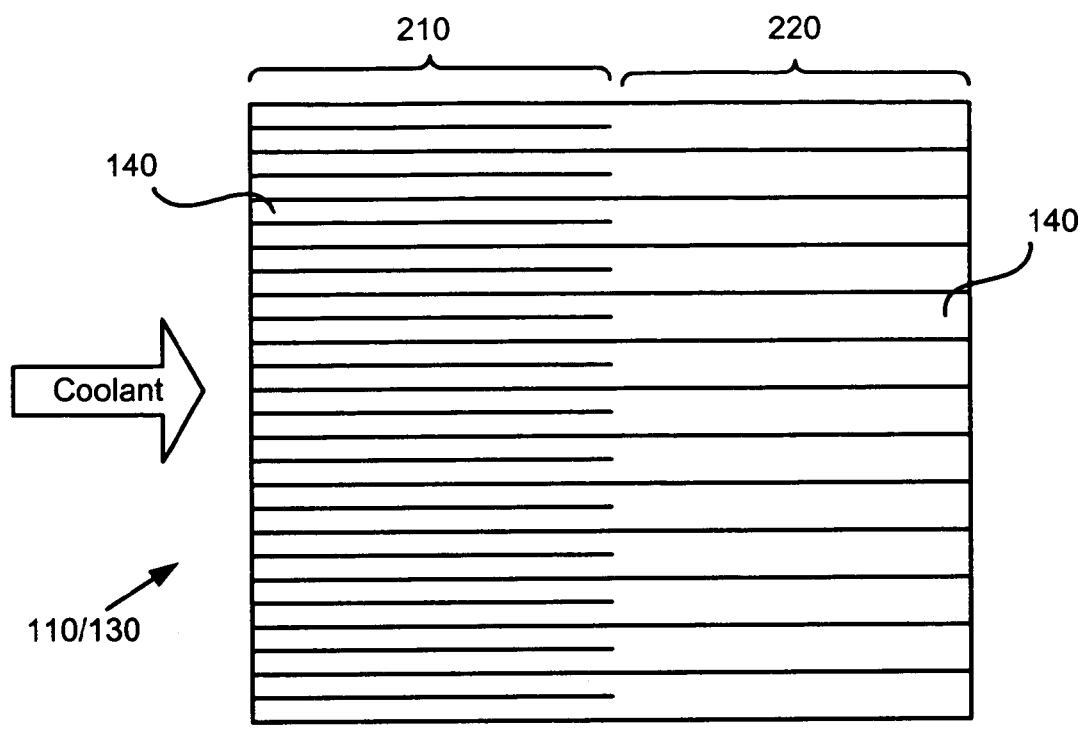
FIG. 2 is a top view of cooling channels in one example implementation consistent with the principles of the invention.

FIG. 2 is a top view of cooling channels 140 in one of heat exchange layer 130 (in device 100 in FIG. 1A) or integrated circuit chip 110 (in device 100' in FIG. 1B) according to one example implementation consistent with the principles of the invention. In the example shown, coolant flows from left to right, although coolant flow in the opposite direction is also possible. The horizontal lines in FIG. 2 may illustrate the walls separating adjacent channels 140 as shown in FIGS. 1A and 1B. As illustrated in FIG. 2, channels 140 may be narrower (and denser) in one area 210 of device 100/100' and may be wider (and less dense) in another area 220 of device 100/100'.

Sometimes, certain areas of integrated circuit chip 110 may have a greater power density, hence generating more heat, than other areas. For the purposes of illustration, area 210 may be assumed to have a greater power density than area 220 of device 100/100'. The greater density of channels 140 in area 210 facilitates greater heat removal from area 210, and the lower density of channels 140 in area 220 may accomplish removal of the lower amount of heat from area 220. Because of the wider channels 140 in area 220, the coolant in channels 140 may experience a lower total pressure drop across device 100/100' than if the narrower/denser channels 140 in area 210 also extended across area 220.

The ratio of channel densities in areas 210 and 220 may be varied according to design, pressure drop, and heat removal choices. Although the channel density ratio between areas 210 and 220 is illustrated as about two in FIG. 2, this channel density ratio may vary from 1.5 to 4 or more. The widths of channels 140 in areas 210 and 220 may vary approximately inversely to the channel density. For example, if the density of channels 140 in area 210 is four times that of channels 140 in area 220, then the channels 140 in area 210 may be about one-fourth as wide as channels 140 in area 220.

Figure 3:
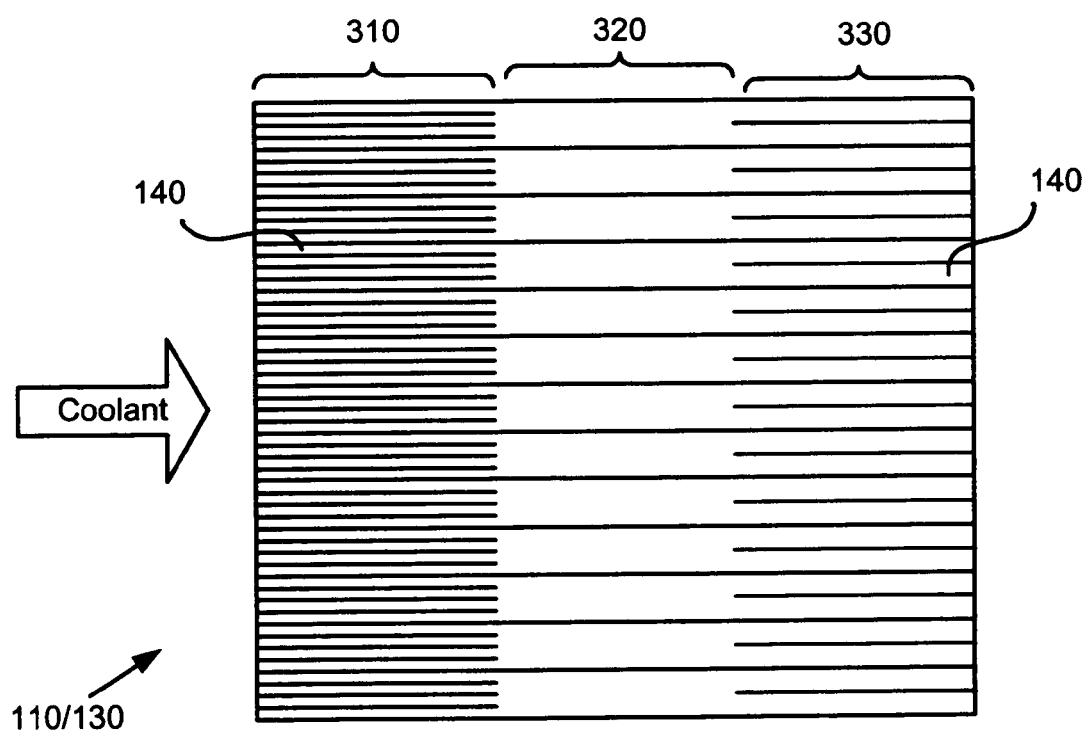
FIG. 3 is a top view of cooling channels in another example implementation consistent with the principles of the invention.

FIG. 3 is a top view of channels 140 in one of heat exchange layer 130 (in device 100 in FIG. 1A) or integrated circuit chip 110 (in device 100' in FIG. 1B) according to another example implementation consistent with the principles of the invention. In contrast to FIG. 2, integrated circuit chip 110 in FIG. 3 may have three or more areas having different power densities. Area 310 may be assumed to have the highest power density, followed in order by area 330 and area 320 that has the lowest.

As illustrated in FIG. 3, channels 140 may be the most dense (to provide the most heat transfer) in area 310, the least dense (to provide the least heat transfer) in area 320, and medium-dense (to provide an intermediate amount of heat transfer) in area 330. Channels 140 in areas 310, 320, and 330 may have a density ratio of about 4 to 1 to 2 and a width ratio of about 1 to 4 to 2. Other ratios among channels 140 in areas 310, 320, and 330 are both possible and contemplated. In any event, because of the wider channels 140 in areas 320 and 330, the coolant in channels 140 may experience a lower total pressure drop across device 100/100' than if the narrower/denser channels 140 in area 310 also extended across areas 320 and 330.

It should be noted that the ordering of channel densities in areas 310–330 may differ from that shown in FIG. 3 if motivated by a different power density map of integrated circuit chip 110. Further, the densities of channels 310–330 need not all be different. For example, the density of channels 140 in area 330 may be the same as the high density in area 310.

Figure 4:
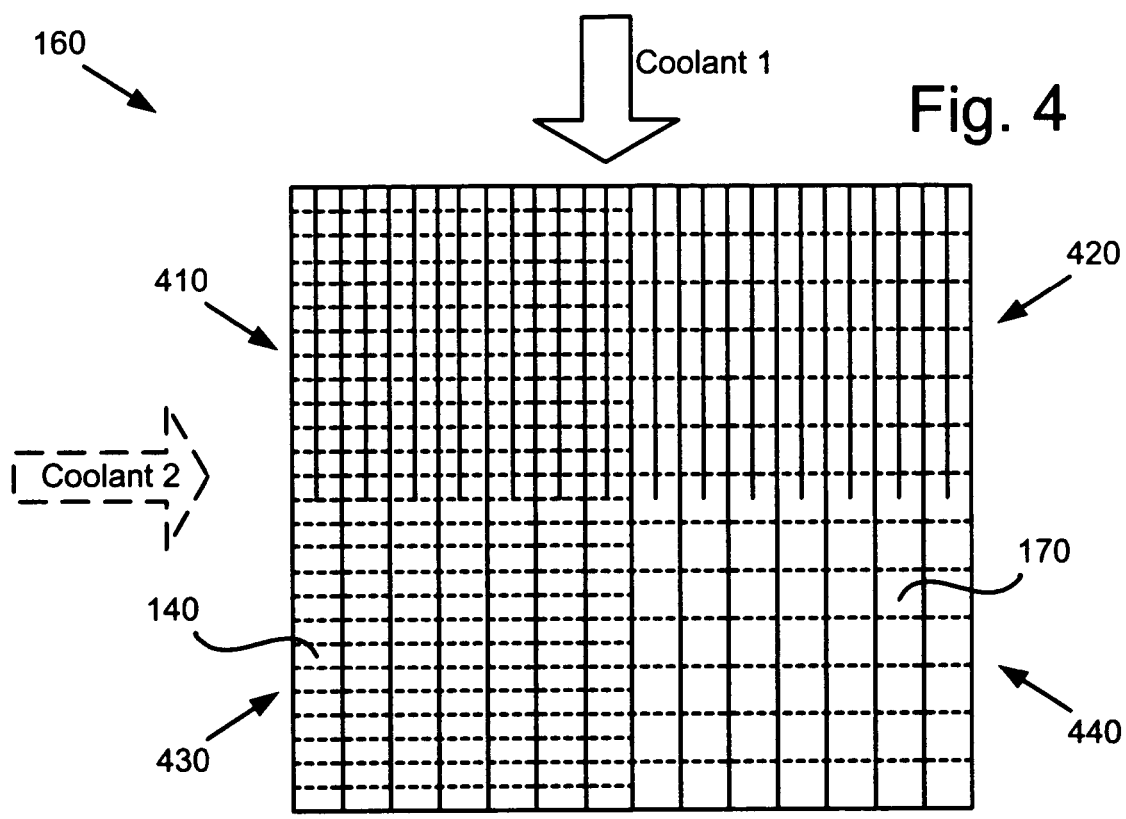
FIG. 4 is a top view of cooling channels in a further example implementation consistent with the principles of the invention.
Figure 5:
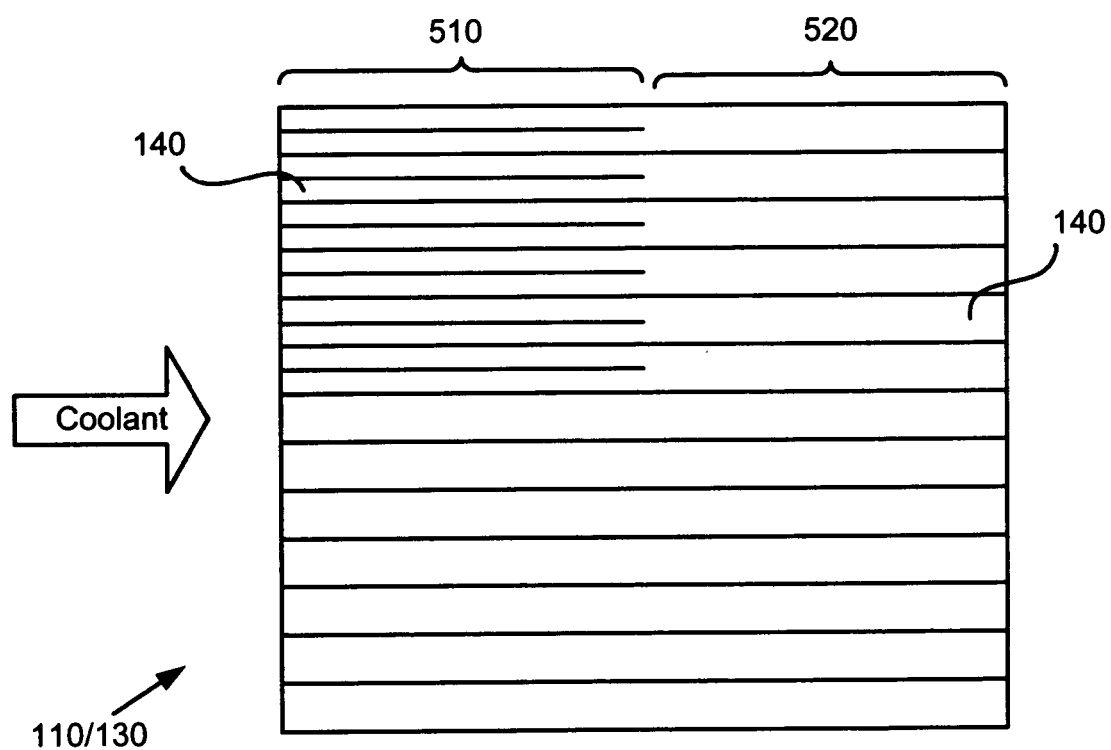
FIG. 5 is a top view of cooling channels in yet another example implementation consistent with the principles of the invention.

For fluid flow reasons, the areas 210 and 310 of higher channel density (and hence greater heat transfer) in FIGS. 2 and 3 may extend widthwise across device 100 or 100'. Not all areas of higher power densities in integrated circuits, however, may extend from one side of device 100/100'to an opposite side. Thus FIGS. 4 and 5 illustrate two example schemes for providing greater cooling to an area that does not extend all the way across device 100/100'. Although the area of greatest heat transfer in FIGS. 4 and 5 is located in the upper left quadrant of device 100/100', other areas are possible, depending on the location of greatest power density in integrated circuit chip 110.

FIG. 4 is a top view of upper channels 170 in upper heat exchanger 160 and channels 140 (shown by dotted lines) in integrated circuit chip 110 (or heat exchange layer 130) according to another example implementation consistent with the principles of the invention. As illustrated, a first coolant may flow through upper channels 170, which are illustrated using solid lines in upper heat exchanger 160. A second coolant may flow in an orthogonal direction to the first coolant through lower, hidden channels 140 (shown by dotted lines) in integrated circuit chip 110 (or heat exchange layer 130) under upper heat exchanger 160.

As may be seen from FIG. 4, each of upper channels 170 and channels 140 may have a more-dense and less-dense geometry similar to that shown in FIG. 2. Area 410 in the upper left quadrant of device 100' may include an overlap of more-dense upper channels 170 and more-dense channels 140. Areas 420 and 430 in the upper right and lower left quadrants of device 100' may include an overlap of either more-dense upper channels 170 and less-dense channels 140, or less-dense upper channels 170 and more-dense channels 140. Area 440 in the lower right quadrant of device 100' may include an overlap of less-dense upper channels 170 and less-dense channels 140.

The greatest heat transfer may occur in area 410, due to the overlap of two sets of more-dense channels. The lowest heat transfer may occur in area 440, due to the overlap of two sets of less-dense channels. Areas 420 and 430 may have a heat transfer amount between those of areas 410 and 440. In this manner, an area of high power density (e.g., corresponding to area 410) that does not extend fully across device 100' may be differently cooled from other areas due to the joint operation of the first coolant in upper channels 170 and the second coolant in channels 140.

FIG. 5 is a top view of channels 140 in one of heat exchange layer 130 (in device 100 in FIG. 1A) or integrated circuit chip 110 (in device 100' in FIG. 1B) according to a further example implementation consistent with the principles of the invention. Channels 140 may be more densely spaced in area 510 (e.g., a quadrant), and may be less dense in area 520 (e.g., the remainder of device 100/100'). Although such an arrangement may cause uneven coolant flow between the more-dense channels 140 and the less-dense channels 140 at the side where the coolant enters, it may still provide increased cooling in area 510, presumably an area of higher power density.

In some implementations consistent with the principles of the invention, channels 140/170 may have a uniform width and geometry along a certain area (e.g., areas 210, 220, 310, 320, 510, etc.). This type of uniform channel geometry may results in boundary layers (e.g., both flow velocity and thermal) developing in the coolant adjacent to the walls of channels 140/170. The boundary layers may increase in width along the length of channels 140/170, and the associated heat transfer coefficient may decrease along the channels 140/170.

Figure 6A:
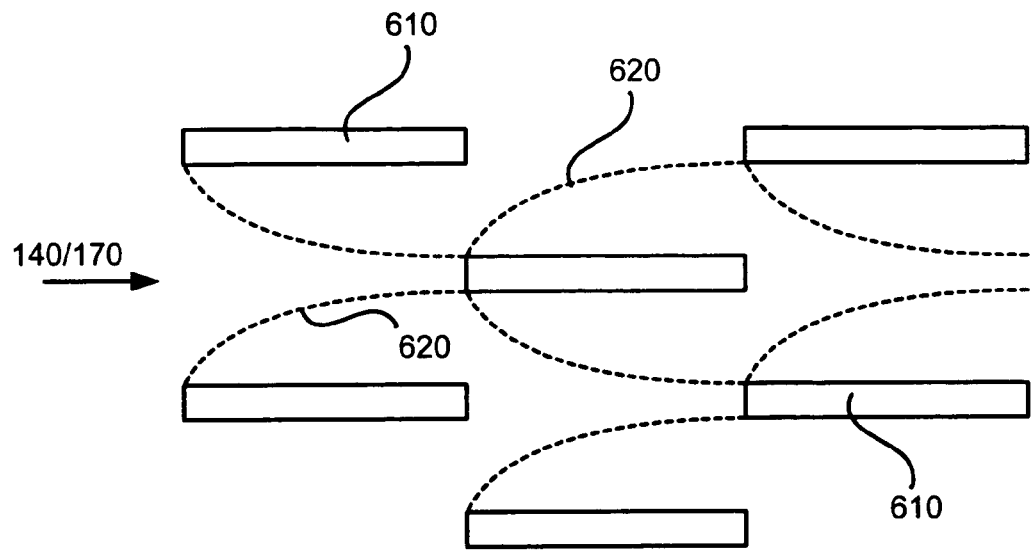
FIG. 6A is a top view of segmented cooling channels in another example implementation consistent with the principles of the invention.

In other implementations consistent with the principles of the invention, however, channels 140/170 may have a non-uniform geometry along a certain area (e.g., areas 210, 310, 510, etc.). FIG. 6A is a top view of non-uniform, segmented cooling channels 140/170 consistent with the principles of the invention. Walls 610 that define channels 140/170 may be staggered and/or offset and/or discontinuous so that velocity and/or thermal boundary layers 620 in the coolant are restarted. As illustrated in FIG. 6A, an offset wall 610 in channel 140/170 may disrupt a growing boundary layer 620, and start the growth of its associated boundary layer 620 anew.

Offset walls 610 may cause a larger amount of the channels 140/170 to be in a "developing flow" regime (e.g., where boundary layers 620 are beginning). The associated heat transfer coefficient may be higher in the developing flow regions than in, for example, in a channel 140/170 with a long-established boundary layer.

Figure 6B:
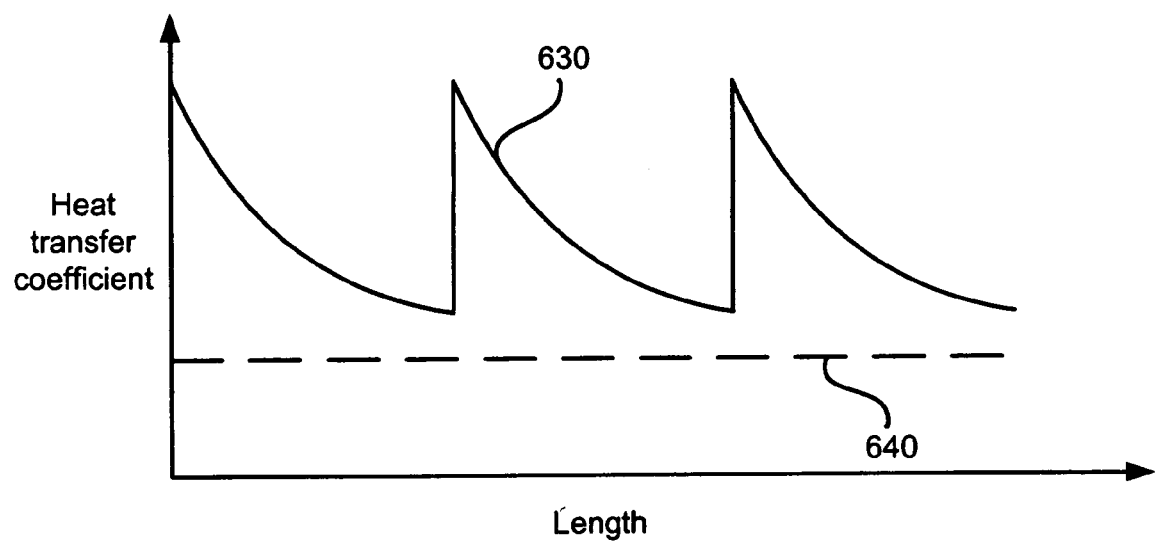
FIG. 6B is a representative plot of heat transfer corresponding to the cooling channels of FIG. 6A.

FIG. 6B is a representative plot 630 of heat transfer corresponding to the cooling channels 140/170 of FIG. 6B. As may be seen, the heat transfer coefficient in plot 630 is highest before a boundary layer 620 (in FIG. 6A) becomes established. By contrast, level 640 conceptually illustrates the heat transfer of a channel 140 with no offsets and a fully-grown or established boundary layer. The overall heat transfer coefficient in the cooling area of channels 140/170 (e.g., the average of plot 630) may be higher than level 640 in the case where channel walls 610 are not offset or staggered. Channels 140/170 in FIG. 6A may also have a lower overall thermal resistance due to the offsetting or staggering of channels 140/170 via their walls 610.

Figure 7:
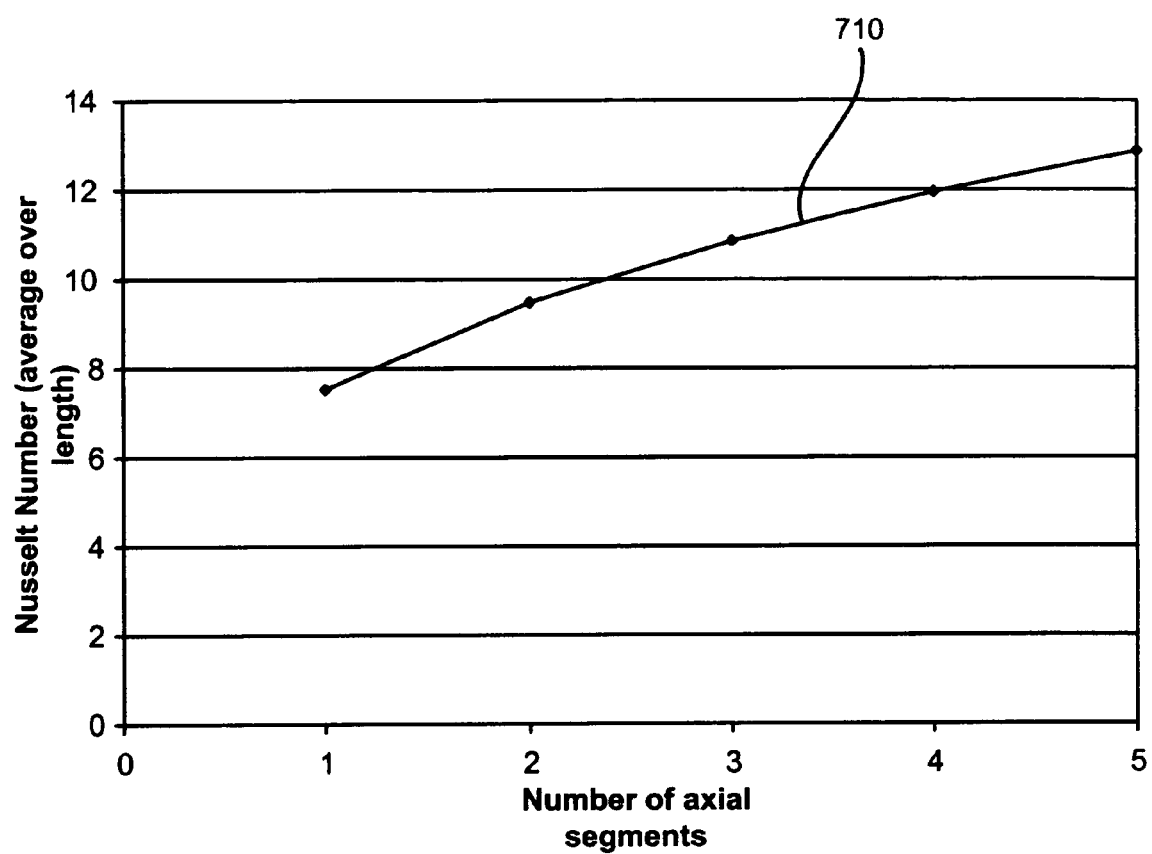
FIG. 7 is a plot relating heat transfer to a number of segments in a cooling channel.

FIG. 7 is a plot 710 relating heat transfer to a number of segments in a cooling channel. The length-averaged Nusselt number, which corresponds to the overall heat transfer coefficient of channels 140/170, may increase with the number of channel segments. As may be seen from FIG. 7, breaking up the coolant flow one or more times (via two or more axial segments, respectively) may provide an increase in heat transfer over a uniform channel 140/170, the one axial segment data point on the left end of plot 710.

Further, the channel offsetting scheme described with regard to FIGS. 6A to 7 may be used in different areas of a device 100/100'. Although the channel offsetting scheme may be used in both of areas 210 and 220 in FIG. 2, in some implementations it may be used only in the higher density area 210, but not in the lower density area 220. That is, area 210 may include two or more segments of channels 140 (corresponding to one or more channel offsets), but area 220 may include uniform channels 140 (e.g., one segment across all of area 220).

Moreover, the channel offsetting scheme described with regard to FIGS. 6A to 7 may facilitate use of wider channels 140 to achieve a desired amount of heat transfer. For example, if a constant channel width of 75 µm achieves a desired level of cooling across area 210, the same desired level of cooling also may be achieved with a channel width of 100 µm and two or more channel segments across area 210. That is, a channel density ratio between areas 210 and 220 may be relaxed from, for example, 4 to 3 while maintaining a desired amount of heat transfer by using the channel offsetting scheme in area 210. Although described with regard to areas 210 and 220 in FIG. 2, the principles of the invention are equally applicable to the example configurations in FIGS. 3–5 and any modifications thereof.

The foregoing description of one or more implementations consistent with the principles of the invention provides illustration and description, but is not intended to be exhaustive or to limit the claimed invention to the precise form disclosed. Modifications and variations are possible in light of the above teachings or may be acquired from practice of the invention.

For example, the techniques described above may be applied to an integrated circuit chip or processor that has two, three, four, or more different areas of heating. Also, although the cooling channels herein have been described by themselves, other cooling techniques also may optionally be used. For example, a cooling fan (or other forced-air cooling device) may or may not be used in conjunction with device 100 or 100'.

Also, although the changes in channel density have been illustrated as abrupt or discontinuous transitions, channel density may also vary continuously in a region between two regions of distinct channel densities. For example, the density of channels 140/170 may vary roughly linearly between regions of different, but constant, channel densities. Further, although the widths of channels 140/170 have been illustrated as roughly constant within a given density region, the widths of channels 140/170 may vary within a given density region as long as the average widths of channels 140/170 are different for different regions of device 100/100'.

Further, although the density of channels 140/170 have been illustrated as being different in different thermal regions of device 100/100', it may be possible to have a uniform channel density across the device and achieve greater cooling in one thermal region by staggering or offsetting channels multiple times within that region.

No element, act, or instruction used in the description of the present application should be construed as critical or essential to the invention unless explicitly described as such. Also, as used herein, the article "a" is intended to include one or more items. Where only one item is intended, the term "one" or similar language is used. Variations and modifications may be made to the above-described implementation(s) of the claimed invention without departing substantially from the spirit and principles of the invention. All such modifications and variations are intended to be included herein within the scope of this disclosure and protected by the following claims.

What is claimed:

1. A device, comprising:
   an integrated circuit chip; and enclosed channels to carry a liquid coolant that are proximate to a surface of the integrated circuit chip and that extend in parallel lines along an entire length of the integrated circuit chip, wherein a density of the channels changes abruptly at least twice across the length of the integrated circuit chip.

2. The device of claim 1, wherein the channels are formed in the integrated circuit chip and substantially under the surface of the integrated circuit chip.

3. The device of claim 1, further comprising:
a heat exchange layer over the integrated circuit chip,
wherein the channels are formed in the heat exchange layer.

4. The device of claim 3, further comprising:
a cap on the beat exchange layer to at least partialy define the channels.

5. The device of claim 3, further comprising:
an interface layer between the integrated circuit chip and the heat exchange layer.

6. The device of claim 1, wherein the channels include:
a first area having a first channel density, and
a second area adjacent to the first area and having a second channel density that is lower than the first channel density.

7. The device of claim 6, wherein at least one of the first and second areas span a full width of the integrated circuit chip.

8. The device of claim 6, wherein the channels further include:
a third area adjacent to the second area having a third channel density that is different than the second channel density.

9. The device of claim 6, wherein the channels are longitudinally offset at least once within the first area.

10. A device, comprising:
a semiconductor base including an area of higher power density and an area of lower power density;
a heat exchange layer over the semiconductor base and including parallel enclosed channels formed therein suitable for carrying liquid coolant; and
an upper heat exchange layer over and in a parallel plane to the heat exchange layer and including parallel upper channels formed therein that are enclosed and suitable for carrying liquid coolant,
wherein a density of the parallel enclosed channels over the area of higher power density is higher than a density of the parallel enclosed channels over the area of lower power density.

11. The device of claim 10, further comprising:
a thermal interface layer between the semiconductor base and the heat exchange layer.

12. The device of claim 10, further comprising:
a plate on the heat exchange layer to at least partially define the channels.

13. The device of claim 10, wherein a ratio of the density of the channels over the area of higher power density to the density of the channels over the area of lower power density is greater than about 1.1.

14. The device of claim 10, wherein the channels over the area of higher power density include at least two staggered segments.

15. The device of claim 10, wherein the semiconductor base includes an area having an intermediate power density that is between the higher power density and the lower power density, and wherein a density of the channels over the area having the intermediate power density is higher than the density of the channels over the area of lower power density and is lower than the density of the channels over the area of higher power density.

16. The device of claim 10, wherein a density of the upper channels over the area of higher power density is higher than a density of the upper channels over the area of lower power density.

17. The device of claim 10, wherein a direction of the channels in the heat exchange layer is substantially orthogonal to a direction of the upper channels in the upper heat exchange layer.

18. A device, comprising:
an integrated circuit chip including linear enclosed channels in a surface thereof;
a cap connected to the integrated circuit chip to define a top of the channels,
wherein an average width of the linear enclosed channels substantially changes at least once along a length of the channels; and
a heat exchange layer over and parallel to the cap and including linear upper channels formed therein that are enclosed and suitable for carrying liquid coolant,
wherein an average width of the linear upper channels substantially changes at least once along a length of the linear upper channels.

19. The device of claim 18, wherein the channels include one area of higher average width and a different area of lower average width, and
wherein a ratio of the higher average width to the lower average width is less than about 8.

20. The device of claim 18, wherein the channels include one area of higher average width and a different area of lower average width, and
wherein the channels within the area of lower average width include at least one discontinuity.

21. The device of claim 18, wherein an average width of the channels substantially changes at least twice along a length of the channels.

22. The device of claim 18, wherein a direction of the length of the channels in the integrated circuit chip is substantially orthogonal to a direction of the length of the upper channels in the heat exchange layer.

23. A method, comprising:
forming first parallel channels in a layer of a semiconductor device;
forming second parallel channels in the layer of a semiconductor device adjacent to one end of the first channels and in a same direction as the first parallel channels, the second parallel channels having a greater average width than the first parallel channels; and
capping the first and second parallel channels to form a channel structure suitable for carrying liquid coolant in a single direction through the semiconductor device.

24. The method of claim 23, wherein the layer of the semiconductor device includes copper, aluminum, or silicon.

* * * * *